United States Patent [19]

Tokas et al.

[11] Patent Number: 5,348,574
[45] Date of Patent: Sep. 20, 1994

[54] METAL-COATED POLYIMIDE

[75] Inventors: Edward F. Tokas; Raafat M. Shaltout, both of St. Louis; Ken S. Chen, Grover, all of Mo.

[73] Assignee: Monsanto Company, St. Louis, Mo.

[21] Appl. No.: 87,228

[22] Filed: Jul. 2, 1993

[51] Int. Cl.⁵ .............................................. C23C 18/18
[52] U.S. Cl. ................................ 106/1.11; 106/1.05
[58] Field of Search ............................... 106/1.05, 1.11

[56] References Cited

U.S. PATENT DOCUMENTS

| | | | |
|---|---|---|---|
| 3,179,614 | 6/1965 | Edwards | 260/30.2 |
| 3,179,634 | 4/1965 | Edwards | 260/78 |
| 3,937,857 | 2/1976 | Brummett et al. | 427/98 |
| 3,954,570 | 5/1976 | Shirk | 204/15 |
| 4,021,314 | 5/1977 | Dafter, Jr. | 106/1.05 |
| 4,078,096 | 3/1978 | Redmond et al. | 106/1.05 |
| 4,112,139 | 9/1978 | Shirk et al. | 427/54 |
| 4,368,281 | 1/1983 | Brummett et al. | 523/458 |
| 4,806,395 | 2/1989 | Walsh | 427/444 |
| 4,832,799 | 5/1989 | Knudsen et al. | 204/22 |
| 4,847,139 | 7/1989 | Wolf et al. | 428/209 |
| 4,900,618 | 2/1990 | O'Connor et al. | 428/328 |
| 4,910,072 | 3/1990 | Morgan et al. | 428/212 |
| 4,992,144 | 2/1991 | Walsh et al. | 204/20 |
| 5,015,517 | 5/1991 | Walsh | 428/156 |
| 5,066,545 | 11/1991 | Walsh | 428/626 |
| 5,082,734 | 1/1992 | Vaughn | 428/411 |
| 5,135,779 | 8/1992 | Vienbeck et al. | 427/304 |
| 5,160,452 | 11/1992 | Martusoka et al. | 106/1.05 |
| 5,176,743 | 1/1993 | Reichert et al. | 106/1.11 |
| 5,178,914 | 1/1993 | Goldblatt et al. | 427/306 |
| 5,183,692 | 2/1993 | Mukerji et al. | 427/304 |

*Primary Examiner*—Helene Klemanski
*Attorney, Agent, or Firm*—Thomas E. Kelley

[57] ABSTRACT

Electroless deposition-catalyzing film-forming solutions comprising polyamic acid and noble metal, e.g. palladium complexed with ammonia, in an aprotic solvent, e.g. N-methyl-2-pyrrolidone with a surfactant. Such solutions are used to provide articles having a coating or patterned image of a electrolessly-depositable element such as copper, nickel and the like on high heat resistant substrates, e.g. metals, ceramics, glass, silicon, high heat polymers and thermoset polymers. In the methods of this invention a polyamic acid/noble metal solution is applied as a coating or patterned image to provide a coherent polyamic acid film which can be imidized, e.g. by heat treatment at 250° C. or higher, providing a tough, adhesive polyimide film that can catalyze electroless deposition.

8 Claims, No Drawings

METAL-COATED POLYIMIDE

Disclosed herein are metal-coated polyimide, e.g. metallized circuits on polyimide film, polyamic acid solutions for providing catalytic metal films on polyimide and other high temperature substrates and methods for making and using such solutions and metal-coatings.

BACKGROUND OF THE INVENTION

U.S. Pat. Nos. 4,910,072, 4,900,618 and 5,082,734 disclose selective catalytic activation of catalytically inert polymeric films having essentially no metal on the surface. Such selectively activatable films are prepared from solutions of polymer and noble metal compounds. Maintaining adhesion of the catalyst to the surface is of considerable importance since loosely adhered catalytic metal can be washed from the surface in the agitation of the plating bath causing depletion of the metal value of the plating bath as uncontrolled metal deposition occurs, resulting in what is commonly referred to as a "crashed" bath. Adhesion of the catalytic layer to the substrate also affects the ultimate adhesion of the plated metal. Compatibility of a catalytic polymer film with a substrate, e.g. in terms of surface tension, hydrogen bonding or mechanical adhesion, etc., can be important in providing a strongly adherent metal layer. Certain polymer substrates, e.g. parts having sufficient thickness, are commonly etched or swelled at the surface to provide anchoring sites for colloidal palladium catalyst. Due to their chemical and thermal resistant polyimide film are perceived to be desirable substrates for flexible circuitry applied by electroless deposition. Such chemical and thermal resistance provide unique challenges to appropriate surface treatment that will allow adherent metal coatings. Among the inventive solutions to this technical challenge is flame treatment as disclosed in U.S. Pat. No. 3,954,570. Alternatively, polyimide films have been treated with caustic solutions to generate amic acid salt groups on the surface followed by application of solubilized or colloidal palladium as disclosed in U.S. Pat. Nos. 3,937,857, 4,992,144, 5,178,914 and 5,183,692. A mechanical means of providing a porous surface is disclosed in U.S. Pat. No. 4,847,139 where a copper laminated coating is removed from a polyimide film by etching to provide surface amenable to conventional plating pretreatment.

One difficulty encountered in the use of films of polyamic acid and noble metal catalysts results from the tendency of palladium to catalyze the oxidation of polyamic acid at elevated temperatures typically required to effect imidization, e.g. at about 250° C. and higher in the presence of oxygen.

SUMMARY OF THE INVENTION

Despite the adverse effects of palladium on catalytic decomposition of polyamic acid, this invention provides electroless deposition-catalyzing film-forming solutions comprising polyamic acid and noble metal in an aprotic solvent. Such solutions preferably also comprise surfactant and noble metal complexing agent, e.g. ammonia. Such solutions are used to provide articles having a coating or patterned image of a electrolessly-depositable element such as copper, nickel and the like. In the methods of this invention a polyamic acid/noble metal solution is applied as a coating or patterned image to provide a coherent, polyamic acid film which can be imidized, e.g. by heat treatment in the range of 250° to 350° C., providing a catalytic polyimide film. In view of high temperatures required for imidization, this invention advantageously provides electrolessly-deposited metal coatings on substrates having high working temperature; such substrates include metals, ceramics, glass, silicon, high heat polymers and thermoset polymers.

DETAILED DESCRIPTION OF PREFERRED EMBODIMENTS

As used herein the term "polyamic acid" means a polymeric, macromolecular compound of the structural formula

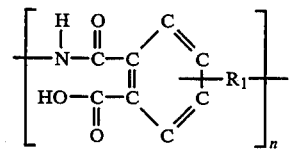

where n, on average, is greater than 10;
where $R_1$ is a carbon-carbon bond, —C(O)—, a $C_1$-$C_{12}$ alkyl group, a $C_1$-$C_{12}$ alkylene group, a polyakylene oxide, or

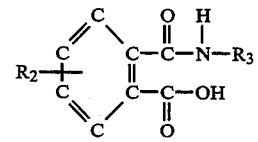

where $R_2$ is a carbon-carbon bond, —C(O)—, —SO$_2$—, —CH$_2$—, —CH(CH$_3$)—, —C(CH$_3$)$_2$—, —C(CF$_3$)$_2$—, or —O—; where $R_3$ is a $C_1$-$C_{12}$ alkyl group, a $C_1$-$C_{12}$ alkylene group, a polyakylene oxide, —phenyl—, —phenyl—$R_4$— phenyl— or —phenyl—O— phenyl—$R_4$—phenyl—O—phenyl—; where $R_4$ is a carbon-carbon bond, —C(O)—, —SO$_2$—, —CH$_2$—, —CH(CH$_3$)—, —C(CH$_3$)$_2$—, —C(CF$_3$)$_2$— or —O—.

As used herein the term "noble metal" means palladium, platinum, rhodium, iridium, ruthenium, silver or gold.

As used herein the term "aprotic solvent" means acetone, dimethylacetamide, dimethylformamide, dimethylsulfoxide, ethylene dichloride, methyl ethyl ketone, methyl isobutyl ketone, tetrahydrofuran, N-methyl-2-pyrrolidone, toluene, xylene, mixtures thereof or mixtures thereof with water, e.g. less than 10 parts water per hundred parts solvent.

This invention provides electroless deposition-catalyzing film-forming solutions comprising:

(A) 0.1 to 15 weight percent, preferably greater than 1.25 weight percent, of a polyamic acid (as defined above), (B) 0.1 to 15 parts per hundred parts of polyamic acid (pph) of noble metal (as defined above), (C) 60 to 95 weight percent of an aprotic solvent (as defined above), (D) 0 to 10 weight percent of an anionic or non-ionic surfactant; and (E) aqueous ammonium hydroxide in an amount to provide a molar ratio of ammonia to noble metal in the range of 1 to 10.

Preferred polyamic acids prepared by condensation polymerization of an aromatic tetracarboxylic acid and a diamine are commercially available or can be prepared by well known methods, e.g. as disclosed in U.S. Pat. Nos. 3,179,614 and 3,179,634. In practice the number of repeat units of the two monomer compounds, n, will range from 2 to about 100 or more, depending on reaction conditions, e.g. the concentration of reactants. Typically n, on average, will be greater than 10, say about 20, or more. Preferred polyamic acids have a structural formula where $R_1$ is

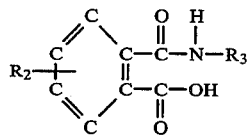

where $R_2$ is —C(O)— and $R_3$ is —phenyl—O—phenyl—$R_4$— phenyl—O—phenyl— and $R_4$ is —C(CH$_3$)$_2$—. An especially preferred polyamic acid is the condensation product of aromatic tetracarboxylic acid anhydride and bis(aminophenoxyphenyl)propane, where n is typically about 20.

Typically, the noble metal of choice in the electrolessly plating industry is palladium which is advantageously provided in solution complexed with concentrate (e.g. 30 wt %) aqueous ammonia. A preferred aprotic solvent having high solubility for polyamic acids and minimal environmental impact is N-methyl-2-pyrrolidone, which is favorably miscible with the small amounts of water used to provide a soluble noble metal complex.

Catalytic polyimide films formed by imidization of a polyamic acid film tend to be hydrophobic with respect to metal electroless plating solutions. That is, it is often difficult to achieve adequate wetting for desired plating performance. Plating can be enhanced by steps to more closely match the surface tension of the polyimide surface and the plating solution, e.g. by incorporating a surfactant in the polyimide film or in the plating solution. Surfactants can be incorporated in the polyimide film by employing an anionic or non-ionic surfactant in the polyamic acid film-forming solution. Preferred anionic surfactants are alkyl, aryl or alkaryl compounds having carboxylic acid, sulfonic acid or hydroxyl end groups; such anionic surfactants include alkyl sulfates such as the sodium tetradecyl sulfate and sodium 2-ethylhexyl sulfate and Dowfax alkylated disulfonated diphenyl oxides (both available from Dow Chemical Company). Preferred non-ionic surfactants include Triton X-100 non-ionic surfactant of octylphenoxypolyethoxyethanol (available from Rohm & Haas) and Fluorad fluorinated aliphatic polyester non-ionic surfactant (available from 3M). Alternatively, a useful surfactant for use in a plating solution is any of the aprotic solvents, preferably N-methyl-2-pyrrolidone.

Preferred electroless deposition-catalyzing film-forming solutions comprise 0.5 to 10 weight percent of polyamic acid, 1 to 10 pph palladium, 85 to 95 weight percent of a solvent mixture of N-methyl-2-pyrrolidone and water, 0.1 to 1 weight percent non-ionic surfactant wherein said surfactant is a fluorinated aliphatic polyester, and sufficient concentrated aqueous ammonia to provide a molar ratio of ammonia to palladium is in the range of 3 to 7.

The solutions of this invention are useful for providing electrolessly-deposited metal, e.g. as a coating or patterned image, on high heat resistant substrates having a working temperature greater than 300° C., more preferably greater than 350° C., even more preferably greater than 400° C. In the case of thermoplastic polymer substrates, working temperatures are advantageously characterized by heat distortion temperature under load (HDTUL) determined according to ASTM Standard Procedure D 648 measured on 3 mm thick specimen bars stressed at 9.3 Pascals (64 psi). In the case of non-thermoplastic materials, such as metals or thermoset polymers working temperatures are characterized by melt or decomposition temperature. For instance, a preferred embodiment of this invention employs a polyimide film, e.g. as available from DuPont as Kapton TM VN polyimide film which has no measurable HDTUL or melt temperature but has a second order glass transition temperature (Tg) greater than 360° C. In the case of metal plated circuits, such polyimide film is also preferred due to its high dielectric properties. Thus, useful substrates having high working temperature include metal such as aluminum and steel, metal oxides such as aluminum oxide and titanium oxide, ceramics such as carbides and aluminosilicates, glass, silicon, gallium arsenide, and the like. Useful substrates can comprise high heat resistant thermoplastic polymers such as polyimide, polysulfone, polyethersulfone, polyphenylene oxide, polyphenylene sulfide, polyether ketone, polyesterether ketone and polyimidazole. Useful substrates can also comprise thermoset polymers, e.g. crosslinked polymers, such as polyepoxide, thermoset polyester, thermoset polyacrylate, thermoset polyurethane. Mixtures of high heat substrates are also useful including mixtures of polymers and mixtures of polymers with inorganic materials such as metal filler.

Such high heat resistant substrates are useful in practicing the methods of this invention where it is desired to electrolessly deposit an element as a coating or patterned image on such substrates. Electrolessly depositable elements include metals such as copper, nickel, cobalt, tin, silver, gold, palladium and platinum, a mixture or alloy of metals and mixtures or alloys of metals with phosphorus. Phosphorus alloys and mixtures are produced when metals are deposited using hypophosphite as a reducing agent.

In the methods of this invention selected areas, e.g. full web or patterns, of a substrate are coated with an electroless deposition-catalyzing film-forming solution comprising 0.1 to 15 weight percent of polyamic acid and 0.1 to 15 pph noble metal in an aprotic solvent. The noble metal is present in said solution as a salt or complex of an element selected from the group consisting of palladium, platinum, rhodium, iridium, ruthenium, silver and gold; preferably a palladium compound, such as palladium acetate, where solubility of the palladium is effected using ammonia as a complexing agent. The coating or patterned image is formed into a coherent film of polyamic acid and dispersed noble metal salt or complex by evaporating the solvent from the selected areas.

Such coherent films can be heated to a temperature of at least 250° C., preferably at least 300° C. or higher, say up to about 340° C., for sufficient time to convert the polyamic acid to polyimide with the attendant liberation of water. Such heating also effects aggregation of the noble metal salt or complex into clusters of reduced noble metal, noble metal salt, noble metal complex or mixtures thereof. With activation heating such clusters tend to form on and near the exposed surface of the polyimide. Regardless of oxidation state of the metal, the clusters are catalytic to electroless deposition when exposed to the reducing environment of an electroless plating bath. Thus, the heating provides a catalytic, coating or patterned-image layer of polyimide and noble metal clusters.

As illustrated in the following examples there is a minimum and maximum heating time for optimum plating results, e.g. strongly adherent, thick electroless deposits without blisters, i.e. hydrogen bubbles under deposited metal. Activation for optimum plating can be readily determined with a modicum of experimentation with variables such as activation time and temperature, noble metal concentration, width and thickness of the polyamic acid/noble metal film, presence of oxygen and the like. For instance, at any activation temperature there is a time dependent plating effect which ranges from insufficient noble metal clusters for catalyzing plating at short times, to modest plating that is followed by blister formation to optimum plating (strongly adherent, thick metal deposition), to loosely adherent metal at long times. When the noble metal is palladium, these effects are believed to be due in part to the tendency of palladium to catalyze the oxidation of polyimide. When polyimide substrates are used, there is evidence that heating can cause some palladium clusters to penetrate the polyimide substrate providing exceptionally strong adhesion. However, if heating is conducted for too long, the palladium clusters degrade the polyimide matrix binding the clusters leaving clusters to lie loosely adhered to the substrate material, allowing a deposited metal to flake off the substrate with the application of minimal strain. Polyimide degradation has not been observed when activation is effected in an inert atmosphere like nitrogen.

The cause for blister formation is believed to be due to hydrogen that tends to aggregate under large metal areas. In the case of fine line plating, in contrast to full surface plating, it is believed that hydrogen diffuses out from under the deposited metal at a high enough rate to avoid blister formation. It has also been observed that blisters tend to form under copper deposits but not under nickel deposits.

Thus, the catalytic polyimide/noble metal surface can be immersed in an electroless deposition solution to provide an article comprising a high heat resistant substrate having a coating or patterned image of a electrolessly-depositable element selected from the group consisting of: (a) an element selected from the group consisting of copper, nickel, cobalt, tin, silver, gold, palladium and platinum, (b) a mixture or alloy of said elements, and (c) a mixture or alloy of said elements with phosphorus. Such articles are characterized as having an interfacial layer between the substrate and the electrolessly-deposited element, where the interfacial layer comprises a mixture of polyimide and dispersed clusters of noble metal selected from the group consisting of palladium, platinum, rhodium, iridium, ruthenium, silver and gold. In preferred cases where the noble metal is palladium, the interfacial layer comprises polyimide and palladium in the weight ratio of 10 to 100.

In an especially preferred embodiment this invention provides metal patterned circuits or signal carrying network of copper, nickel or cobalt on a flexible polyimide film, e.g. on one or both sides of a polyimide film. The patterned metal circuit is typically electrolessly deposited to a thickness of 0.1 to 4 micrometer. A thicker metal circuit, e.g. greater than 5 micrometers, for instance up to 35 micrometers thick, can be provided by electrolessly plating for an extended period of time or preferably by building the metal galvanically in an electrolytic plating bath. A thicker metal pattern can be homogeneous or bimetallic with one metal coated above an initial electroless metal deposit.

The invention is now described with reference to the following examples which are for purposes of illustration only and are not intended to imply any limitation on the scope of the invention. In these examples the following materials are used:

NMP: N-methyl-2-pyrrolidone.
NMP-T: a 50:50 mixture of NMP and toluene.
PdAc$_2$: palladium acetate.
Surfactant FC430: Fluorad TM fluorinated aliphatic polyester surfactant from 3M.
Polyimide Film: polyimide film available from DuPont as Kapton TM VN polyimide film, a condensation product of pyromellitic dianhydride and 4,4'-diaminophenylether, 75 micrometers thick, having a second order Tg between 360° C. and 410° C.
Polyamic Acid Solution: 36% polyamic acid in NMP where the Polyamic Acid is a condensation product of benzophenonetetracarboxylic acid anhydride and bis-(aminophenyoxyphenyl)propane, n is about 21.
Copper Bath: an electroless copper plating bath typically comprising 1.5 to 4 g/l soluble cupric ions, about 3 to 6 g/l formaldehyde and EDTA in a molar ratio EDTA/Cu of about 2/1, at pH 11.5–12.5 and typically used at a temperature of 25° to 45° C.
Nickel Bath: an electroless nickel plating bath typically comprising 6 g/l nickel ions chelated with tartrate and 30 g/l sodium hypophosphite monohydrate at pH 6.5 and typically at a temperature of 60° C.

EXAMPLE 1

Film-forming solutions of polyamic acid and noble metal were prepared by mixing 3.5 g of Polyamic Acid Solution, 9.65 g of NMP-T and 0.264 g of PdAc$_2$ providing a solution comprising 1.25 wt % polyamic acid and 10 pph palladium. The film-forming solution was coated onto Polyimide Film using a 50 micrometer doctor blade; the solution was dried at 65° C. for 20 minutes providing a polyamic acid/palladium film which was catalytically activated by heating at 250° C. for 20 minutes to effect imidization and formation of palladium clusters. The activated polyimide/palladium cluster-coated film was immersed in a Copper Bath for 6.5 minutes providing a polyimide film coated with copper to a thickness of about 0.4 micrometers.

EXAMPLE 2

The procedure of Example 1 was essentially repeated except palladium was at 4 pph and the polyamic acid/palladium film was catalytically activated by heating at 250° C. for 70 minutes. The activated polyimide/palladium cluster-coated film was immersed in a Copper Bath for 3.8 minutes providing a polyimide film coated with copper to a thickness of about 0.2 micrometers.

EXAMPLE 3

This example illustrates the effect of activation time on plating quality and thickness. The procedure of Example 1 was essentially repeated using a solution of 1.25% polyamic acid and 10 pph palladium. A polyamic acid/palladium film, catalytically activated by heating at 250° C. for 20 minutes, was highly catalytic, i.e. it could be immersed in a Copper Bath for only 37 seconds before blistering of the copper deposit was observed; copper thickness at blistering was about 0.05 micrometers. A polyamic acid/palladium film, catalytically activated by heating at 250° C. for 55 minutes, was less catalytic, i.e. it could be immersed in a Copper Bath for up to 240 seconds before blistering of the copper deposit was observed; copper thickness at blistering was about 0.2 micrometers.

EXAMPLE 4

This example illustrates the effect of palladium concentration on processing parameters, e.g. activation time. The procedure of Example 1 was essentially repeated except that palladium was at 7 pph and 4 pph. The polyamic acid/palladium film at 7 pph palladium was catalytically activated by heating at 250° C. for 60 minutes; when immersed in a Copper Bath for 207 seconds, copper was deposited to a thickness of about 0.2 micrometers. The polyamic acid/palladium film at 4 pph palladium was catalytically inert after heating at 250° C. for 60 minutes; the film became catalytically active when heated at 250° C. for 70 minutes; when immersed in a Copper Bath for 240 seconds, copper was deposited to a thickness of about 0.25 micrometers.

EXAMPLE 5

This example illustrates the application of this invention for printed circuits on polyimide film. A polyamic acid/palladium solution was prepared comprising 13.8 wt % Polyamic Acid, 5 pph palladium in NMP, with aqueous ammonium hydroxide to provide a molar ratio of ammonia to palladium of 5:1. A circuit pattern (about 250 micrometer line width) of the solution was printed onto Polyimide Film using a gravure roll. The solution was dried; and, portions of the film were activated at 300° C. for times ranging from 1 to 4 minutes, then immersed for 6 minutes in a 2 g/l Copper Bath (modified to 12.5 vol. % NMP). Films activated for 1 minute provided shinier copper deposits than films activated for 4 minutes. A film activated for 4 minutes was allowed to remain in the modified Copper Bath for 15 hours providing a copper deposit that was about 3.6 micrometers thick.

EXAMPLE 6

A solution was prepared comprising 9% Polyamic Acid, 5 pph palladium, 0.25% Surfactant FC430 and aqueous ammonium hydroxide in NMP (molar ratio of ammonia to palladium of 5:1). Using a Meyer-rod coater the solution was applied to both side of a length of Polyimide Film (about 300 meters long by 0.3 meters wide), sequentially by coating each side and drying each side for about 20 seconds in a convection oven at 180° C. Wet polyamic acid/palladium thickness was in the range of 25 to 75 micrometers. A short length (about 1.25 meters long) of the film was activated by heating at 300° C. for 8 minutes, followed by immersion in a Nickel Bath for 5 minutes providing nickel deposits on both sides of the film. Nickel coatings were 0.4 to 0.5 micrometers thick with adhesive peel strength of about 800 newtons/meter.

EXAMPLE 7

A solution was prepared essentially according to Example 6 except that the solution comprised 12.5% Polyamic Acid, 10 pph palladium, 0.17% Surfactant FC430 and ammonia (5:1) in NMP. The solution was coated onto Polyimide Film, dried and activated by heating at 250° C. for 20 minutes. The film was divided and immersed for 3 minutes in Copper Bath and for 5 minutes in Nickel Bath. Metal deposits were about 0.05 micrometers thick and strongly adhered to the polyimide exhibiting peel strengths greater than 700 newtons/meter.

COMPARATIVE EXAMPLE 7

A solution was prepared using an emulsion of a vinyl acetate/vinyl chloride copolymer (Geon TM 590X20 49% solids latex from Goodyear) in place of Polyamic Acid; the solution comprised 5 wt % copolymer, 3.5 pph palladium, 4 pph Triton TM X-100 surfactant, aqueous ammonium hydroxide (molar ratio of ammonia/palladium of 5:1) in water. The solution was coated onto Polyimide Film, dried, and activated by heating at 160° C. for 5 minutes. The film was divided for immersion in both Copper Bath and Nickel Bath. Copper deposited to about 0.05 micrometers; nickel deposited from about 0.05 to 0.2 micrometers. Both copper and nickel had low adhesion to the polyimide and was readily removed by hand scratching.

EXAMPLE 8

This example illustrates the positive effect of higher temperature activation and longer activation time on increasing plating time (and thus raising plating thickness) before the formation of blisters. A solution prepared essentially according to Example 6 was coated onto both sides of a Polyimide Film and dried to provide a polyamic acid/palladium film. The film was divided into a plurality of segments, each of which was activated by heating under time/temperature conditions indicated in Table 1. The activated polyimide/palladium cluster-coated films were immersed in a Copper Bath (4 g/l copper and 44° C.) until there was an indication of blister formation; the plating time and thickness of the deposited copper is indicated in Table 1.

TABLE 1

| Activation temperature | Activation time | Plating time | Copper thickness |
|---|---|---|---|
| 300° C. | 10 min | 2 min | 0.2* |
| 310 | 10 | 2.6 | 0.25 |
| 315 | 10 | 5 | 0.5 |
| 320 | 10 | 6.5 | 0.7 |
| 325 | 10 | 19.7 | 1.7 |
| 330 | 10 | 20 | 1.8 |
| 335 | 10 | 26 | 2.2 |
| 340 | 10 | 33 | 2.4 |
| 345 | 10 | 36 | 2.8 |
| 350 | 10 | 48 | 3.6 |
| 300 | 14 | 2.6 | 0.3 |
| 300 | 16 | 3 | 0.35 |
| 300 | 20 | 4.2 | 0.5 |
| 300 | 24 | 10.5 | 1.0 |
| 300 | 30 | 13 | 1.2 |
| 300 | 40 | 27.7 | 2.5 |

*micrometers

EXAMPLE 9

This example illustrates the utility of this invention in the high volume production of antenna patterns on Polyimide Film. A solution according to Example 6 was used as an ink for printing a repetitive patterns on Polyimide Film using a Mark Andy 830 flexographic printing press. The pattern comprised a plurality of 15 millimeter (nun) squares connected by 0.2 mm lines in a 250 mm by 140 mm rectangular area. The printed solution was dried by heating to provide printed pattern of polyamic acid/palladium about 0.2 micrometer thick. The film was divided into sections which were activated by heating at 340° C. at 10, 15, and 20 minutes. The activated catalyst patterns were immersed in a Copper Bath (4 g/l copper and 35° C.) until the onset of blistering (observed in the 15 mm square areas) as indicated in Table 2.

TABLE 2

| Activation temperature | Activation time | Plating time | Copper thickness |
|---|---|---|---|
| 340° C. | 10 min | 88.4 min | 2.5* |
| 340 | 15 | 114.4 | 3.2 |
| 340 | 20 | 133.0 | 3.7 |

*micrometers

While specific embodiments have been described herein, it should be apparent to those skilled in the art that various modifications thereof can be made without departing from the true spirit and scope of the invention. Accordingly, it is intended that the following claims cover all such modifications within the full inventive concept.

What is claimed is:

1. An electroless deposition-catalyzing film-forming solution comprising:

(A) 0.1 to 15 weight percent of a polyamic acid of the structural formula

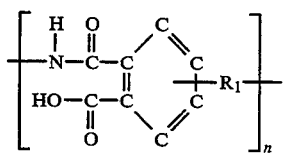

where n is greater than 10;
where $R_1$ is a carbon-carbon bond, —C(O)—, a $C_1$-$C_{12}$ alkyl group, a $C_1$-$C_{12}$ alkylene group, a polyakylene oxide, or

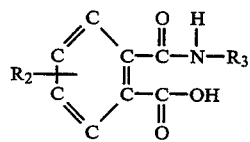

where $R_2$ is a carbon-carbon bond, —C(O)—, —SO$_2$—, —CH$_2$—, —CH(CH$_3$)—, —C(CH$_3$)$_2$—, —C(CF$_3$)$_2$—, or —O—; where $R_3$ is a $C_1$-$C_{12}$ alkyl group, a $C_1$-$C_{12}$ alkylene group, a polyakylene oxide, —phenyl—, —phenyl—R$_4$—phenyl— or —phenyl—O—phenyl—R$_4$—phenyl—O—phenyl—; and where $R_4$ is a carbon-carbon bond, —C(O)—, —SO$_2$—, —CH$_2$—, —CH (CH$_3$)—, —C(CH$_3$)$_2$—, —C(CF$_3$)— or —O—;

(B) 0.1 to 15 parts per hundred parts of polyamic acid of a noble metal selected from the group consisting of palladium, platinum, rhodium, iridium, ruthenium, silver and gold;

(C) 60 to 95 weight percent of an aprotic solvent selected from the group consisting of acetone, dimethylacetamide, dimethylformamide, dimethylsulfoxide, ethylene dichloride, methyl ethyl ketone, methyl isobutyl ketone, tetrahydrofuran, N-methyl-2-pyrrolidone, toluene, xylene, mixtures thereof and mixtures thereof with water; and (D) 0 to 10 weight percent of an anionic or non-ionic surfactant.

2. A solution according to claim 1 further comprising aqueous ammonium hydroxide in an amount to provide a molar ratio of ammonia to noble metal in the range of 1 to 10.

3. A solution according to claim 2 comprising greater than 1.25 weight percent polyamic acid.

4. A solution according to claim 1 comprising 0.5 to 10 weight percent of polyamic acid wherein $R_1$ is

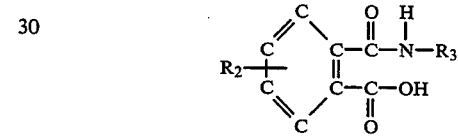

where $R_2$ is —C(O)— and $R_3$ is —phenyl—O—phenyl—R$_4$—phenyl—O—phenyl— and $R_4$ is —C(CH$_3$)$_2$—.

5. A solution according to claim 4 comprising 1 to 10 parts per hundred of noble metal comprising palladium.

6. A solution according to claim 5 comprising 85 to 95 weight percent solvent comprising a mixture of N-methyl—2—pyrrolidone and water.

7. A solution according to claim 6 comprising 0.1 to 1 weight percent non-ionic surfactant comprising a fluorinated aliphatic polyester.

8. A solution according to claim 7 comprising ammonia in the molar ratio of ammonia to palladium in the range of 3 to 7.

* * * * *